United States Patent
Mathur et al.

(10) Patent No.: US 11,056,880 B1
(45) Date of Patent: Jul. 6, 2021

(54) SNAPBACK ELECTROSTATIC DISCHARGE PROTECTION FOR ELECTRONIC CIRCUITS

(71) Applicant: Western Digital Technologies, Inc., San Jose, CA (US)

(72) Inventors: Shiv Harit Mathur, Bangalore (IN); Nitin Gupta, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/835,837

(22) Filed: Mar. 31, 2020

(51) Int. Cl.
H02H 9/04 (2006.01)
H01L 27/02 (2006.01)

(52) U.S. Cl.
CPC ......... H02H 9/046 (2013.01); H01L 27/0266 (2013.01)

(58) Field of Classification Search
CPC .......................... H02H 9/046; H01L 27/0266
USPC ........................................................... 361/56
See application file for complete search history.

(56) References Cited

U.S. PATENT DOCUMENTS

| | | | |
|---|---|---|---|
| 5,930,094 A | 7/1999 | Amerasekera et al. | |
| 6,690,555 B1 | 2/2004 | Pasqualini | |
| 6,855,586 B2 | 2/2005 | Walker et al. | |
| 7,221,551 B2 | 5/2007 | Chen | |
| 7,304,827 B2* | 12/2007 | Chen | H01L 27/0285 361/56 |
| 7,372,681 B2 | 5/2008 | Armer et al. | |
| 7,721,551 B2* | 5/2010 | Hanson | F02K 1/06 60/771 |
| 7,763,940 B2 | 7/2010 | Mergens et al. | |
| 7,782,580 B2* | 8/2010 | Gauthier, Jr. | H01L 27/0285 361/56 |
| 7,791,851 B1 | 9/2010 | Luquette et al. | |
| 8,363,368 B2* | 1/2013 | Poulton | H01L 27/0285 361/56 |
| 8,767,359 B2* | 7/2014 | Zhu | H02H 9/046 361/56 |
| 9,001,479 B2* | 4/2015 | Chuang | H01L 27/0266 361/56 |
| 9,356,443 B2* | 5/2016 | Yang | H02H 9/046 |
| 9,893,517 B2* | 2/2018 | Dey | H01L 29/78 |
| 9,941,267 B2* | 4/2018 | Tsai | H01L 27/0285 |
| 2010/0265622 A1 | 10/2010 | Campi, Jr. et al. | |
| 2013/0027820 A1* | 1/2013 | Padilla | H02H 9/046 361/56 |

(Continued)

Primary Examiner — Dharti H Patel
(74) Attorney, Agent, or Firm — Patterson & Sheridan, LLP; Steven H. Versteeg

(57) ABSTRACT

Snapback ESD protection circuits that include an Input/Output pad, a ground source, a first and a second NMOS transistor, and trigger circuit, pad bias circuit, and gate bias circuit. The first transistor drain connects to the pad. The second transistor drain connects to the first transistor source. The second transistor source connects to ground. The trigger circuit connects to the pad and a reference voltage to detect an ESD event at the pad. The pad bias circuit connects to the pad, the trigger circuit, ground, and the reference voltage to manage a voltage level for the reference voltage. The gate bias circuit connects to the reference voltage, a supply voltage, ground, and the gates of the first and second transistor to dynamically control the voltage of each gate of the first and a second NMOS transistor.

20 Claims, 5 Drawing Sheets

(56) References Cited

U.S. PATENT DOCUMENTS

2015/0180474 A1\* 6/2015 Mathur .......... H03K 19/018521
   326/81

\* cited by examiner

US 11,056,880 B1

SNAPBACK ELECTROSTATIC DISCHARGE PROTECTION FOR ELECTRONIC CIRCUITS

BACKGROUND

Electrostatic discharge (ESD) is the sudden flow of electricity between two electrically charged objects caused by contact, an electrical short, or dielectric breakdown. ESD causes more than one-third of the in-field failures in the semiconductor industry. The shrinking size of semiconductor chips, thin gate oxides, multiple power supplies, chip complexity, and high-speed circuit operation contribute significantly to ESD sensitivity and risk.

ESD protection circuits may be added on signal lines near locations where the lines may be exposed to external circuits, components, and/or effects such as ESD. Because ESD protection circuits are single-purpose circuits designed to protect other circuits from an ESD event, manufacturers desire to make ESD protection circuits as small as possible and that they to consume little or no power. "ESD event" refers to a sudden discharge of charge from a charge carrier into an electrical circuit.

It is advantageous to have the ESD protection circuit fabricated at the time the IC is fabricated. A reasonable protection of up to 2 kV may require a large device area and thus a large cost, as well as higher parasitic capacitance, which may limit performance. Snapback operation cannot be validated in conventional CAD environments due to lack of availability of design models under ESD conditions. Thus, there is a high risk that design flaws and/or deficiencies may not be identified until after wafers and dies are manufactured.

Snapback based ESD (SESD) protection circuits have been proposed, but these SESD protection circuits may not provide effective protection in advanced technologies like as 28 nm, 16 nm etc effective beta of BJT device is quite small. The triggering voltage of snapback devices may be unfavorably high, resulting in large inherent voltage buildup before an SESD circuit responds, which may increase susceptibility to circuit component failure. Cascoding of the components for higher voltage operation support in the snapback circuit may further increase the triggering voltage needed, resulting an even higher failure risk.

The ability of a snapback device to handle large currents relies on the existence of a substrate current path. During an ESD event, the protection circuit enters into snapback operation by turning on the lateral bulk or substrate bipolar junction transistor (BJT) to provide a discharge path for the ESD surge. However, the capability of this BJT to sink current is dependent on strap connections and metal tapping, which are attributes of how the snapback device design is laid out in Silicon. The snapback ESD protection circuit performance is highly dependent on its layout.

Therefore, an improved design architecture is needed to overcome these challenges and take full advantage of snapback protection circuitry in semiconductor design.

BRIEF SUMMARY

This disclosure relates to an electrostatic discharge (ESD) protection circuit, comprising an Input/Output (IO) pad, a ground source, a first NMOS transistor, a second NMOS transistor, a trigger circuit, a pad bias circuit, and a gate bias circuit. The first NMOS transistor has a drain terminal connected to the IO pad, as well as a first gate terminal and a source terminal. The second NMOS transistor has a drain terminal connected in series to the source terminal of the first NMOS transistor, a second gate terminal, and a source terminal connected to the ground source. The trigger circuit is connected to the IO pad and a reference voltage node. The trigger circuit is configured to detect an ESD event at the IO pad. The pad bias circuit is connected to the IO pad, the trigger circuit, the ground source, and the reference voltage node. The pad bias circuit is configured to manage a voltage level for the reference voltage node. The gate bias circuit is connected to the reference voltage node, a supply voltage, the ground source, a first gate node connected to the first gate terminal, and a second gate node connected to the second gate terminal. The gate bias circuit is configured to dynamically control a voltage level for the first gate node and the second gate node.

This disclosure further relates to an ESD protection circuit comprising an IO pad, a ground source, a first NMOS transistor, a second NMOS transistor, a trigger circuit, a fail-safe protection circuit, and a gate bias circuit. The first NMOS transistor has a drain terminal connected to the IO pad, a first gate terminal, and a source terminal. The second NMOS transistor has a drain terminal connected in series to the source terminal of the first NMOS transistor, a second gate terminal, and a source terminal connected to the ground source. The trigger circuit is connected to the IO pad and a reference voltage node. The trigger circuit is configured to detect an ESD event at the IO pad. The fail-safe protection circuit is connected to the IO pad, the trigger circuit, a supply voltage, and the reference voltage node. The fail-safe protection circuit is configured to manage a voltage level for the reference voltage node to enable a voltage level at the IO pad to rise to a predetermined threshold when the supply voltage is substantially zero. The gate bias circuit is connected to the reference voltage node, the supply voltage, the ground source, a first gate node connected to the first gate terminal, and a second gate node connected to the second gate terminal. The gate bias circuit is configured to dynamically control a voltage level for the first gate node and the second gate node.

Finally, this disclosure relates to a control bus of a memory die comprising a plurality of control lines. At least one control line comprising an ESD protection circuit comprising an IO pad, a ground source, a first NMOS transistor, a second NMOS transistor, a trigger circuit, a fail-safe protection circuit, and a gate bias circuit. The first NMOS transistor has a drain terminal connected to the IO pad, a first gate terminal, and a source terminal. The second NMOS transistor has a drain terminal connected in series to the source terminal of the first NMOS transistor, a second gate terminal, and a source terminal connected to the ground source. The trigger circuit is connected to the IO pad and a reference voltage node. The trigger circuit is configured to detect an ESD event at the IO pad using a first resistor and a first capacitor, each configured to charge the first capacitor within a first time constant less than 10 nanoseconds. The fail-safe protection circuit is connected to the IO pad, the trigger circuit, a supply voltage, and the reference voltage node. The fail-safe protection circuit is configured to manage a voltage level for the reference voltage node to enable a voltage level at the IO pad to rise to a fail-safe voltage threshold when the supply voltage is substantially zero. The fail-safe protection circuit comprises a second resistor and a second capacitor, each configured to charge the second capacitor within a second time constant greater than the first time constant. The gate bias circuit is connected to the reference voltage node, the supply voltage, the ground source, a first gate node connected to the first gate terminal, and a second gate node connected to the second gate terminal. The gate bias circuit is configured to dynamically control a voltage level for the first gate node and the second gate node.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

In conventional snapback protection circuits, the gate of one or more snapback devices is tied to ground, or effectively 0 V. Thus, the device channel doesn't take part in current flow as the channel is never turned on with the gate tied low. An improved ESD protective architecture is presented herein, which triggers the gate of one or more snapback devices to supplement ESD current discharge. Embodiments presented herein may also provide overvoltage tolerance (OVT) without increasing the triggering voltage. For example, 3.3V pad protection may be provided on devices using 1.8V without increasing the triggering voltage. In certain embodiments, fail-safe protection may also be provided without increasing the triggering voltage.

The solution disclosed herein may provide improvement regarding the challenges previously discussed. As the gate of the SESD device is triggered during an ESD event, instead of being tied to ground, the gate may be included in the ground path for the excess charge, and thus may provide better protection. This response may also be easier to verify using simulations, leading to a lower risk of failures after manufacturing. The triggering voltage of the cascoded device may also be reduced. The SESD device may then trigger at a lower voltage, providing quicker, better protection.

Embodiments of the disclosed solutions with gate triggering may also take less semiconductor area on the device while still supporting 2 kV protection. Thus, a reduction in area may be accomplished without compromising performance.

Figure 1:
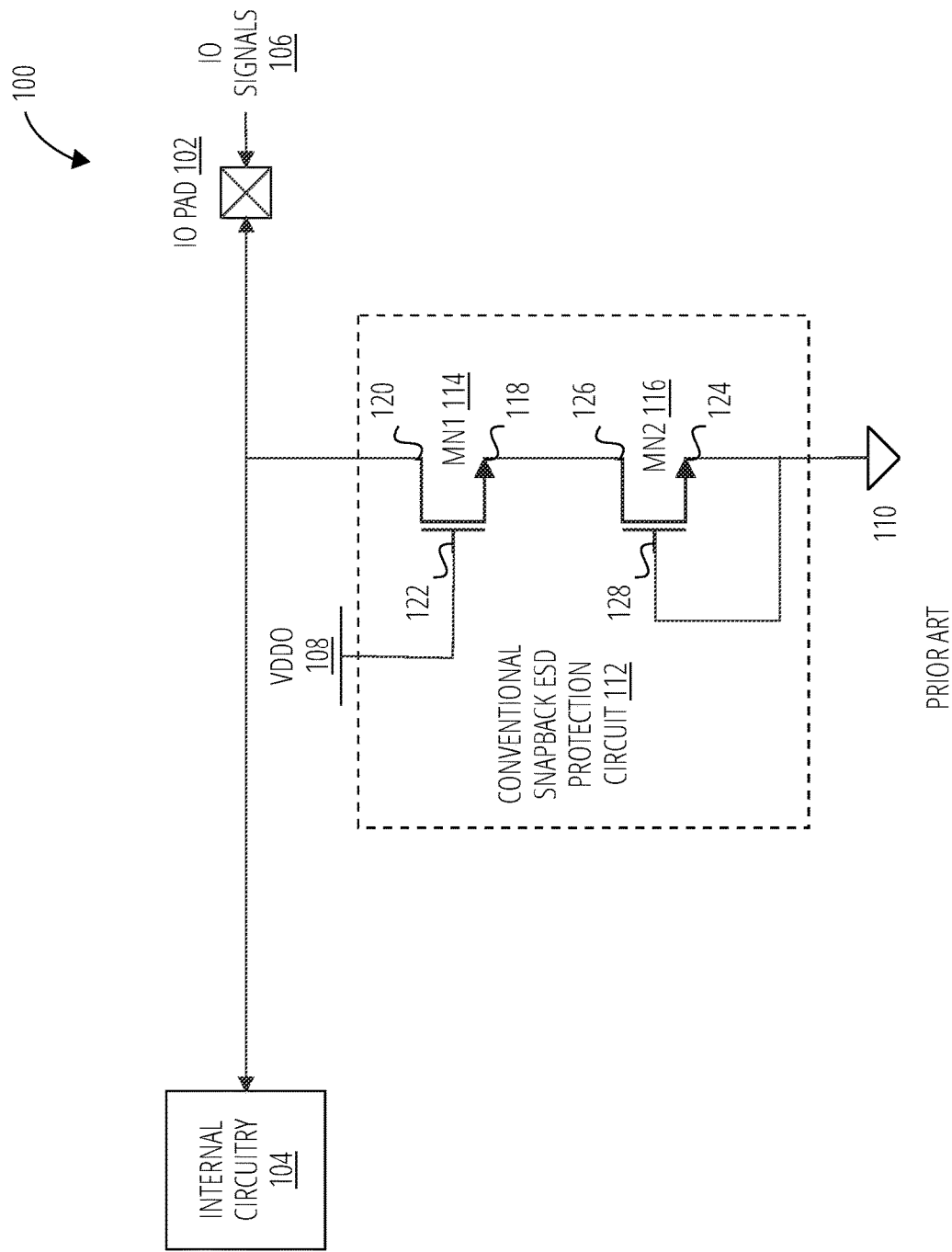
FIG. 1 illustrates a conventional snapback ESD protection circuit 100.

FIG. 1 illustrates a conventional snapback ESD protection circuit 100. The conventional snapback ESD protection circuit 100 comprises an Input/Output (IO) pad 102, internal circuitry 104, IO signals 106, a supply voltage 108, a ground source 110, and a conventional snapback ESD protection circuit 112. The conventional snapback ESD protection circuit 112 comprises an NMOS transistor 1 114, and an NMOS transistor 2 116. NMOS transistor 1 114 comprises a source terminal 118, a drain terminal 120, and a gate terminal 122, and, similarly, NMOS transistor 2 116 comprises a source terminal 124, a drain terminal 126, and a gate terminal 128.

The Input/Output (IO) pad 102 provides a means of connecting signal lines within a semiconductor device such as a memory die or microcontroller to IO signals 106 from external devices. This permits internal circuitry 104, i.e., circuitry designed into the device, to receive these external IO signals 106 and use them in internal operations. "Input/Output (IO) pad" refers to a terminal or other structure of an electronic circuit within a semiconductor or integrated circuit (IC) or packaging for a semiconductor or IC configured to enable the electronic circuit to be coupled, or connected, to another electronic circuit external to the semiconductor or IC or packaging. An IO pad may have a variety of physical forms including a conductor in a ball shape, a planar landing pad for a corresponding ball conductor, or the like. In certain embodiments, an IO pad may make an electrical connection using physical contact between the IO pad and another electrical terminal or lead. An IO pad may be configured to receive electronic communication signals, send electronic communication signals, or both send and receive electronic communication signals.

A supply voltage 108 is provided to the device to power the internal circuitry 104, and a ground source 110 is provided to allow current flow from the supply voltage 108 to ground. This current flow is the mechanism by which electronic circuitry operates. "Supply voltage" refers to a source for a voltage level used to operate an electrical circuit during normal operation.

The conventional snapback ESD protection circuit 112 comprises two cascoded transistors, NMOS transistor 1 114 and NMOS transistor 2 116. "Cascoded" refers to the configuration where the source terminal 118 of the first transistor is fed to the drain terminal of the next transistor, such that the transistors act as a two-stage amplifier having a common emitter and a common base. "Transistor" refers to an electronic component configured to serve as a signal amplifier or as an electronic switch. A transistor comprises a gate terminal, a source terminal, a drain terminal, and a body terminal or just a body. A transistor may comprise a discrete electronic or semiconductor component or may comprise structures or portions of structures or devices embedded in an integrated circuit or semiconductor component or semiconductor device. A transistor operating as a switch is configured such that the source terminal electrically connects to a first electrical structure and the drain terminal electrically connects to a second electrical structure. In a switch configuration, a gate terminal of the transistor connects to a control line. The transistor is activated by increasing a voltage on the control line to, or above, a threshold voltage and deactivated by decreasing the voltage on the control line below a threshold voltage. Activation of a transistor by way of the control line is referred to herein as placing the transistor in a on state. Activation of the transistor forms an electrically conductive path and/or causes the transistor to conduct a current and/or permit a voltage, or bias, to transfer between the source terminal and the drain terminal.

NMOS transistors are typically considered "on" when their gate terminal is "high" and "off" when the gate terminal is "low", when operating in a typical operating range. When an NMOS transistor is "on", electrons flow from source terminal to drain terminal. Current is measured as the flow of positive charge from high potential to low potential, and thus flows in the opposite direct of electrons. When an NMOS transistor is on, then, current flows from drain to source.

The drain terminal 120 of NMOS transistor 1 114 is connected to Input/Output (IO) pad 102. In the illustrated configuration, gate terminal 122 of NMOS transistor 1 114 is tied to, connected to, the supply voltage 108, pulling the gate terminal 122 high when there is a supply voltage 108 and turning NMOS transistor 1 114 on. This protects the conventional snapback ESD protection circuit 112 against electronic overstress during normal operations. However, the gate terminal 128 of NMOS transistor 2 116 is tied to the ground source 110, pulling the gate terminal 128 low and keeping NMOS transistor 2 116 turned off, providing isolation of the Input/Output (IO) pad 102 from ground source 110 during normal operation, so that the Input/Output (IO) pad 102 is not shorted to ground.

The drain terminal 126 of the NMOS transistor 2 116 is connected in series to the source terminal 118 of the NMOS transistor 1 114. The source terminal 124 of the NMOS transistor 2 116 is connected to the ground source 110. In this manner, the NMOS transistor 1 114 and NMOS transistor 2 116 are in a cascoded configuration.

During an ESD event, the Input/Output (IO) pad 102 and thus the drain terminal 120 of NMOS transistor 1 114 jump rapidly to a very high voltage level. NMOS transistor 1 114 provides a path for this voltage away from the internal circuitry 104, though NMOS transistor 2 116 still provides isolation from the ground source 110. However, under high voltage conditions, parasitic characteristics of the semiconductor layers and substrate are activated by the high current in the transistor channels.

When the lateral bulk or substrate BJT turn on, they provide a path for the ESD current to ground while the high voltage condition lasts, allowing the ESD current to flow to ground away from the internal circuitry 104, dissipating the high voltage on the Input/Output (IO) pad 102. This action accounts for the "snapback" behavior, where the voltage on the pad may ramp up quickly but will "snap" back down as the substrate path allows current to dissipate. This substrate current path allows the conventional snapback ESD protection circuit 112 to handle large currents, such as 1.2 A. However, this circuit faces the disadvantages discussed previously, and cannot provide fail-safe protection under normal operating conditions in which the Input/Output (IO) pad 102 voltage goes higher than the supply voltage.

Figure 2:
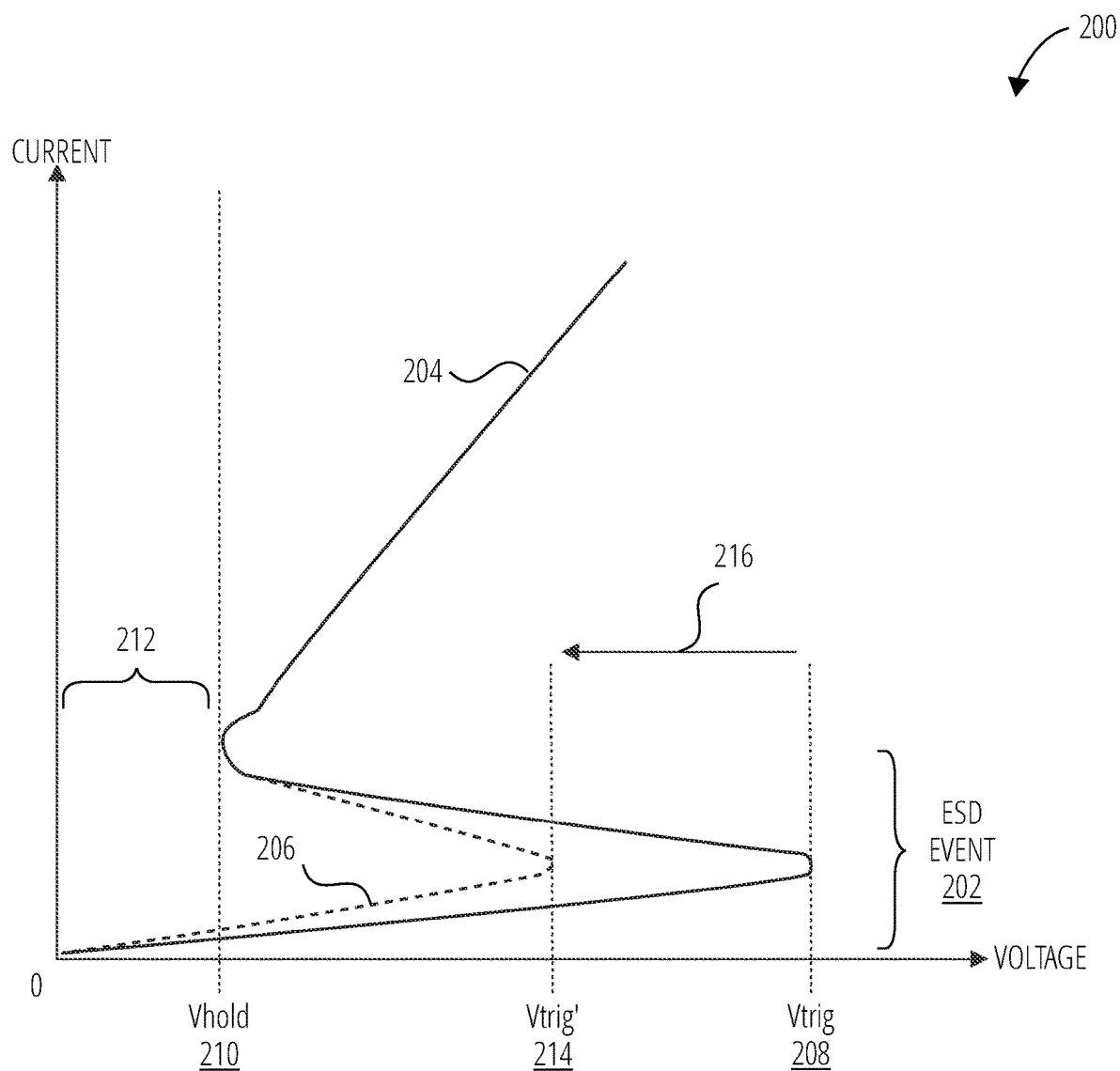
FIG. 2 illustrates a pad voltage snapback comparison 200.

FIG. 2 illustrates a pad voltage snapback comparison 200 between a response in a conventional snapback ESD protection circuit 112, as introduced in FIG. 1, and the claimed embodiments disclosed herein. Voltage responses are illustrated for both circuits during an ESD event 202. A solid line is used to represent the IO pad voltage response with the conventional circuit 204 during the ESD event 202, and a dashed line is used to represent the IO pad voltage response with the disclosed embodiments 206 during a similar event.

During an ESD event 202, the IO pad voltage response with the conventional circuit 204 shows a sharp increase in voltage and a corresponding increase in current, up to the triggering voltage Vtrig 208 for the conventional circuit. When Triggering voltage Vtrig 208 is reached, the IO pad voltage response with the conventional circuit 204 "snaps back" down to a holding voltage Vhold 210, as described with respect to FIG. 1.

"Triggering voltage" refers to a voltage level which, when experienced on a node or signal line within a circuit, causes a snapback action in ESD device. The action may be to turn additional signals on or off, power an indicator or alarm, open a power connection, etc., in response to the triggering voltage being sensed.

"Holding voltage" refers to minimum voltage level at which the snapback device sinks/source higher or same current once snapback device triggers. For a given technology, holding voltage should be more than the voltage of the normal operation range. As the device will return to an OFF state or conducting small current when ON under normal voltage operation range.

Holding voltage Vhold 210 levels represent a safe voltage level for the internal circuitry 104, such that the circuit may be held below, or near this level, without sustaining damage, even as current through the protection circuit rises as shown to dissipate the ESD effects. Once the pad voltage drops below holding voltage Vhold 210 into a safe operating region 212, the protection circuit shuts off, allowing the IO pad to continue transmitting IO signals.

As may be seen for the IO pad voltage response with the disclosed embodiments 206, the triggering voltage Vtrig' 214 for these circuits may be lower than the triggering voltage Vtrig 208, representing an improvement over a conventional response 216. The disclosed circuits, and/or claimed embodiments, may enter snapback at a lower voltage, such that the internal circuitry exposure may be limited to lower ESD voltages and may experience ESD voltages for a shorter period of time.

Figure 3:
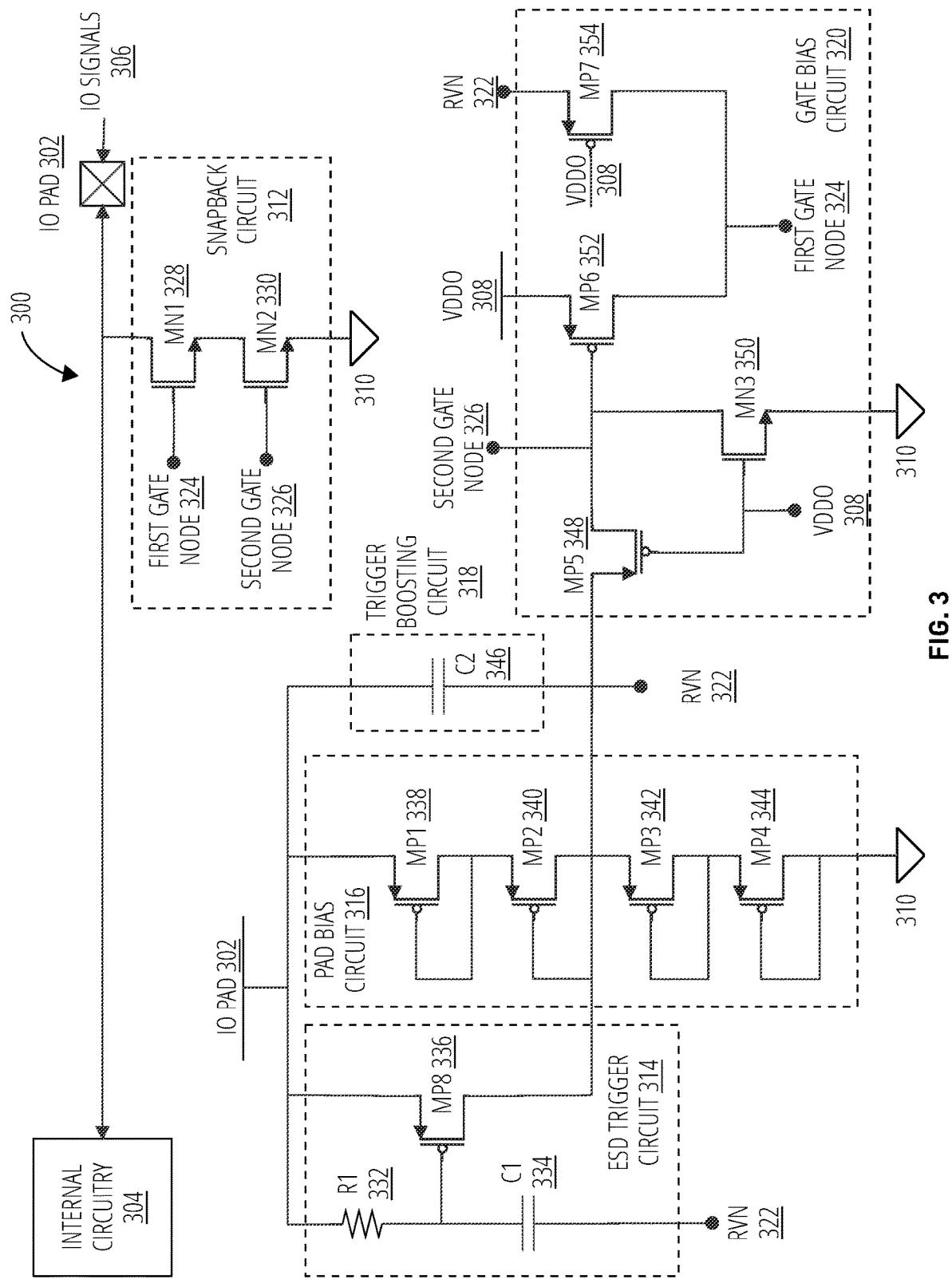
FIG. 3 illustrates an OVT snapback ESD protection circuit 300 in accordance with one embodiment.

FIG. 3 illustrates an OVT snapback ESD protection circuit 300 in accordance with one embodiment. The OVT snapback ESD protection circuit 300 comprises an IO pad 302, internal circuitry 304, IO signals 306, supply voltage 308, and ground source 310, that are effectively similar to the Input/Output (IO) pad 102, internal circuitry 104, IO signals 106, supply voltage 108, and ground source 110 introduced in FIG. 1.

In addition, the OVT snapback ESD protection circuit 300 comprises a snapback circuit 312, an ESD trigger circuit 314, a pad bias circuit 316, a trigger boosting circuit 318, and a gate bias circuit 320. These circuits connect to a reference voltage node 322, a first gate node 324, and a second gate node 326 in order to dynamically bias the transistor gates in the snapback circuit 312. Those of skill in the art will recognize that, in certain embodiments, the snapback circuit 312 includes the ESD trigger circuit 314, pad bias circuit 316, trigger boosting circuit 318, and gate bias circuit 320 and that these parts of the circuit are illustrated without direct connected lines for ease of explanation of the illustrated embodiment.

"Reference voltage node" refers to a node of an electronic circuit that serves as a derived voltage in relation to a voltage level at an IO pad. A voltage level of a reference voltage node may be compared within a snapback ESD circuit to a supply voltage and/or to a voltage level at an IO pad. "First gate node" refers to a node of an electronic circuit that connects to a gate terminal of a first NMOS transistor in a cascoded configuration connected between a second NMOS transistor and an IO pad. "Second gate node" refers to a node of an electronic circuit that connects to a gate terminal of a second NMOS transistor in a cascoded configuration connected between a first NMOS transistor and a ground source.

The snapback circuit 312 comprises an NMOS transistor 1 328 and an NMOS transistor 2 330 cascoded between the IO pad 302 and the ground source 310, similar to the NMOS transistor 1 114 and NMOS transistor 2 116 introduced in FIG. 1. Unlike the conventional snapback ESD protection circuit 112 of FIG. 1, however, the gate terminals of NMOS transistor 1 328 and NMOS transistor 2 330 are dynamically biased by the first gate node 324 and the second gate node 326, respectively, rather than by the supply voltage 108 and ground source 110 as previously described.

The ESD trigger circuit 314 comprises resistor 1 332, capacitor 1 334, and PMOS transistor 8 336. "Trigger circuit" refers to a device, component, element, module, system, sub-system, circuitry, logic, hardware, or circuit configured to activate an ESD protection circuit in response to detecting an ESD event. The resistor 1 332 and capacitor 1 334 may be connected in series between the IO pad 302 and the reference voltage node 322, with resistor 1 332 tied directly to IO pad 302 and capacitor 1 334 tied directly to the reference voltage node 322 as shown. PMOS transistor 8 336 may have its source terminal connected to IO pad 302, its drain terminal connected to the reference voltage node 322, and its gate terminal tied to a node between resistor 1 332 and capacitor 1 334.

The pad bias circuit 316 comprises PMOS transistor 1 338, PMOS transistor 2 340, PMOS transistor 3 342, and PMOS transistor 4 344. "Pad bias circuit" refers to a device, component, element, module, system, sub-system, circuitry, logic, hardware, or circuit configured to bias an IO pad during an ESD event. "Logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

PMOS transistor 1 338 has its source terminal connected to IO pad 302, and its gate terminal and drain terminal connected to the source terminal of PMOS transistor 2 340. PMOS transistor 2 340 has its gate terminal and drain terminal connected to reference voltage node 322. PMOS transistor 3 342 has its source terminal connected to reference voltage node 322 and its gate terminal and drain terminal connected to the source terminal of PMOS transistor 4 344. PMOS transistor 4 344 has its gate terminal and drain terminal connected to the ground source 310.

The trigger boosting circuit 318 comprises capacitor 2 346. capacitor 2 346 is connected between IO pad 302 and reference voltage node 322. "Trigger boosting circuit" refers to a device, component, element, module, system, sub-system, circuitry, logic, hardware, or circuit configured to complement a trigger circuit and mitigate electrical load and/or stress on an IO pad during an ESD event.

The gate bias circuit 320 comprises PMOS transistor 5 348, NMOS transistor 3 350, PMOS transistor 6 352, and PMOS transistor 7 354. "Gate bias circuit" refers to a device, component, element, module, system, sub-system, circuitry, logic, hardware, or circuit configured to bias gate terminals of two or more transistors of an ESD protection circuit in a cascoded configuration. The source terminal of PMOS transistor 5 348 is connected to reference voltage node 322, its gate terminal is tied to supply voltage 308, and its drain terminal connects to the second gate node 326. The drain terminal of NMOS transistor 3 350 also connects to the second gate node 326, its gate terminal connects to supply voltage 308, and its source terminal connects to the ground source 310. the source terminal of PMOS transistor 6 352 connects to supply voltage 308, its gate terminal connects to the second gate node 326, and its drain terminal connects to the first gate node 324. The source terminal of PMOS transistor 6 352 connects to the reference voltage node 322, its gate terminal connects to supply voltage 308, and its drain terminal connects to first gate node 324.

In one embodiment, the ESD trigger circuit 314 is configured to detect an ESD event at the IO pad 302. During normal operation, voltage levels on the IO pad 302 may transition from low to high at an expected rate, based on the speed of data being transmitted as the IO signals 306. The resistor 1 332 and capacitor 1 334 may be selected to provide an RC time constant that will prevent the ESD trigger circuit 314 from reacting, or triggering, during normal operation. ESD events may occur at a speed much faster than the rate at which voltage level on the IO pad 302 normally fluctuates. When the voltage on IO pad 302 increases at a high rate during an ESD event, the configuration of resistor 1 332 and capacitor 1 334 will react, or respond, to turn on PMOS transistor 8 336, which allows the elevated IO Pad 302 voltage to pass through to the second gate node 326 by way of PMOS transistor 5 348 as detailed below. Activating the second gate node 326 in effect turns on the snapback circuit 312 as will be explained.

In one embodiment, the voltage level across capacitor 1 334 may comprise the electromotive force (EMF) of the human body model (HBM) for the ESD event multiplied by $(1-e^{-t/R1C1})$, where e is Euler's number, R1 is the resistance of resistor 1 332, and C1 is the capacitance of capacitor 1 334. (While an HBM is used here, those of skill in the art will recognize that other ESD body models may be used, such as charge device model and machine model.)

R1C1 then form the time constant of this configuration. R1 and C1 may be selected, in certain embodiments, to provide a time constant of about 10 nanoseconds. For example, capacitor 1 334 may be designed to have a capacitance of about 1 picofarad, and resistor 1 332 may be designed to have a resistance of about 10,000 ohms.

The pad bias circuit 316 serves to maintain, generate, and/or manage a voltage level above ground and at, or below, a voltage level at the pad to be used as the reference voltage on the reference voltage node 322. The PMOS ladder formed by PMOS transistor 1 338 through PMOS transistor 4 344 is configured such that the reference voltage node 322 may roughly follow the IO pad 302 voltage. During normal operation, the IO pad 302 voltage may fluctuate between ground (roughly zero volts, as provided by the ground source 310), and VDDO, the supply voltage 308, which in many cases may be around 1.8V. However, this PMOS ladder may not be configured to permit the reference voltage node 322 to follow the IO pad 302 voltage up to (or down to) ESD levels, which may reach 2 kV during an ESD event. To account for the ESD event, the trigger boosting circuit 318 may be configured to boost the reference voltage node 322 higher as the IO pad 302 voltage rises above what the pad bias circuit 316 may support.

The trigger boosting circuit 318 serves to boost, or raise, the reference voltage node 322 during an ESD event. The trigger boosting circuit 318 helps raise the voltage level of the reference voltage node 322 without straining other components of the circuit. This trigger boosting circuit 318 may be configured through an engineered, or designed, value of its capacitor 2 346 to complement the time constant of the ESD trigger circuit 314. The trigger boosting circuit 318 allows the reference voltage node 322 to follow an ESD voltage spike on IO pad, which may mitigate electrical stress on the IO pad, the first NMOS transistor, and the second NMOS transistor during the ESD event. The reference voltage node 322 established by the pad bias circuit 316 may be used by the gate bias circuit 320 to control the first gate node 324 and second gate node 326 voltages of the snapback circuit 312.

The gate bias circuit 320 serves to dynamically control a voltage level for the first gate node 324 and the second gate node 326. During normal operation, PMOS transistor 5 348 may be turned off, as its gate terminal is tied to supply voltage 308, which will be lower than the reference voltage node 322 levels on the source terminal of PMOS transistor 5 348. NMOS transistor 3 350, however, will be turned on by the supply voltage 308 on its gate. (While NMOS transistors are turned on by a "high" voltage on their gate, PMOS transistors are turned on by having a "low" voltage applied to their gate terminal.) With NMOS transistor 3 350 turned on, second gate node 326 is effectively 0 volts due to its connection through NMOS transistor 3 350 to the ground source 310. With second gate node 326 low, PMOS transistor 6 352 will be turned on, allowing first gate node 324 to be effectively at the voltage level of the supply voltage 308. Because supply voltage 308 on the gate of PMOS transistor 7 354 is generally higher than, or roughly equal to, reference voltage node 322, PMOS transistor 7 354 is turned off during normal operation.

Thus, during normal operation, the first gate node 324 voltage may be effectively the supply voltage 308, and the second gate node 326 may be effectively ground. This may allow the snapback circuit 312 to behave exactly as the conventional snapback ESD protection circuit 112 does during normal operations.

During an ESD event, PMOS transistor 8 336 of the ESD trigger circuit 314 is turned on through the action of resistor 1 332 and capacitor 1 334 under ESD timing conditions. This allows the ESD elevated voltage level on IO pad 302 to pass to reference voltage node 322. Reference voltage node 322 is additionally coupled to IO pad 302 by the trigger boosting circuit 318 to improve performance and reduce stress on the circuits as voltages rise quickly.

With the reference voltage node 322 voltage significantly higher than the supply voltage 308, PMOS transistor 5 348 of the gate bias circuit 320 is turned on and NMOS transistor 3 350 is turned off. This results in the second gate node 326 voltage being tied to the higher reference voltage node 322. Because reference voltage node 322 is at a higher voltage than supply voltage 308, PMOS transistor 6 352 turns off, but PMOS transistor 7 354 turns on, tying the first gate node 324 to the reference voltage node 322 as well. With the gates of both NMOS transistor 1 328 and NMOS transistor 2 330 of the snapback circuit 312 tied to first gate node 324 and second gate node 326, respectively, both of which are now equal, or substantially equal, to the ESD elevated reference voltage node 322, NMOS transistor 1 328 and NMOS transistor 2 330 both turn on, providing a direct path to ground, as well as a path through the substrate bipolar junction transistor formed by the semiconductor area that each of NMOS transistor 1 328 and NMOS transistor 2 330 and their channels take up. Note that this represents an improvement over the semiconductor area provided by just the NMOS transistor 1 114 in the conventional snapback ESD protection circuit 100 of FIG. 1.

In addition to ESD events, which involve very rapid application of very high voltages, digital circuitry may sometimes experience voltages moderately higher than they are designed for, but still beyond their tolerances. For example, 1.8V signal lines may be connected to a bus coupled to IO pad 302 that, in some modes, signals at 3.3V. This may be considered an overvoltage (OVT) condition. The OVT snapback ESD protection circuit 300, as configured, tolerates such an overvoltage condition without triggering a path to ground through the snapback circuit 312, which would act to degrade or interfere with the signaling on the bus. In the OVT snapback ESD protection circuit 300, the first gate node 324 value of 1.8V based on supply voltage 308 and the second gate node 326 value of 0V based on the ground source 310 serve to keep the snapback circuit 312 off, providing signal isolation from ground, and allowing the IO pad 302 voltage to swing from 0-3.3V.

This OVT snapback ESD protection circuit 300 may, however, not provide adequate isolation when 3.3V is applied to the IO pad 302 connected to 1.8V internal circuitry 304 when the power supply voltage 308 is off, or at 0V. Such capability is referred to as "fail-safe" protection and is provided by the OVT and fail-safe snapback ESD protection circuit 400 illustrated in FIG. 4.

Figure 4:
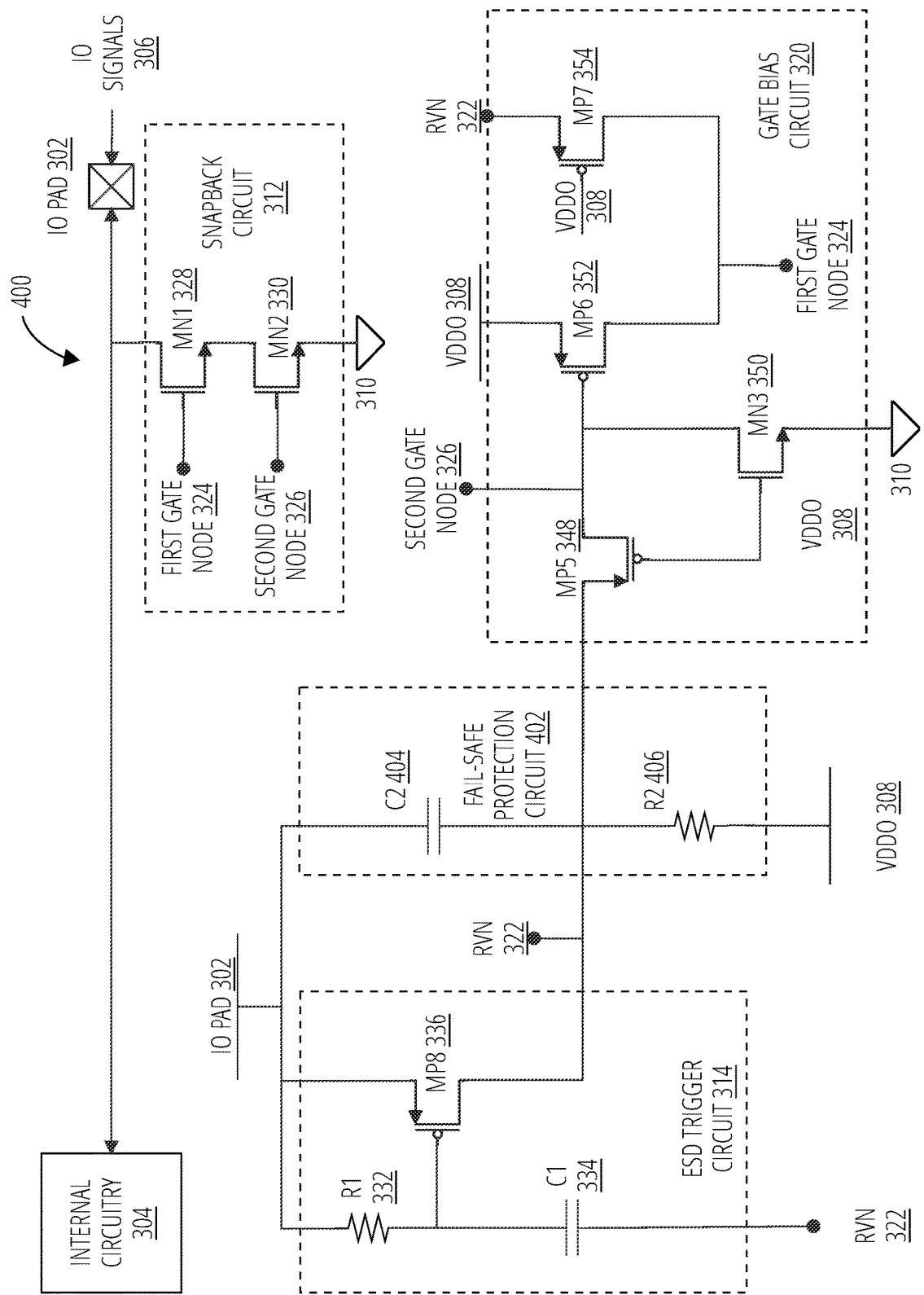
FIG. 4 illustrates an OVT and fail-safe snapback ESD protection circuit 400 in accordance with one embodiment.

FIG. 4 illustrates an OVT and fail-safe snapback ESD protection circuit 400 in accordance with one embodiment. Those of skill in the art will recognize that, in certain embodiments, the snapback circuit 312 of the embodiment illustrated in FIG. 4, includes the ESD trigger circuit 314, fail-safe protection circuit 402, and gate bias circuit 320 and that these parts of the circuit are illustrated without direct connected lines for ease of explanation of the illustrated embodiment.

Many components of the embodiment of FIG. 4 are functionally the same as those introduced with regard to FIG. 3 and are given the same numbers as their FIG. 3 counterparts. The OVT and fail-safe snapback ESD protection circuit 400 of FIG. 4, however, omits the pad bias circuit 316 and additionally comprises a fail-safe protection circuit 402.

The fail-safe protection circuit 402 serves to provide a fail-safe protection function such that data or control signals connected by way of the IO pad 302 are not interrupted, or interfered with, by the OVT and fail-safe snapback ESD protection circuit 400.

The fail-safe protection circuit 402 comprises a capacitor 2 404 and a resistor 2 406. In some embodiments, the capacitor 2 404 may be configured to perform the trigger boosting circuit 318 functions of capacitor 2 346, of FIG. 3. Capacitor 2 404 is connected between IO pad 302 and reference voltage node 322. Resistor 2 406 is connected between reference voltage node 322 and supply voltage 308.

This configuration of capacitor 2 404 and resistor 2 406 allows the OVT and fail-safe snapback ESD protection circuit 400 to determine the reference voltage node 322 in the absence of static power on supply voltage 308. In this manner, the fail-safe protection circuit 402 ensures that the device does not interfere with data or control signals coupled to the IO pad 302, even when the device is powered off. The voltage level across capacitor 2 404 may comprise a fail-safe voltage threshold multiplied by $(1-e^{-t/R2C2})$, where e is the Euler's number, R2 is a resistance of the resistor 2 406, C2 is a capacitance for capacitor 2 404, and R2C2 is a second time constant.

"Threshold" refers to a level, point, magnitude, intensity, or value above which a condition is true or will take place and below which the condition is not true or will not take place. (Search "threshold" on Merriam-Webster.com. Merriam-Webster, 2019. Web. 14 Nov. 2019. Edited)

"Fail-safe voltage threshold" refers to a voltage level representing a maximum voltage level that a circuit, such as a communication bus, coupled to an IO pad may experience during normal operation of an electronic device. A circuit supports fail-safe operation if the circuit is configured to remain passive and not interfere with a coupled circuit, such as a communication bus, when a supply voltage for the fail-safe circuit is substantially zero volts.

"Time constant" refers to a constant value used in a circuit that includes a resistor and a capacitor connected in series, either in a charging configuration with a voltage or potential source or in a discharging configuration with a ground source or load discharging the capacitor. A time constant is a value in seconds equal to a resistance for the resistor multiplied by a capacitance for the capacitor. A time constant may be represented by the Greek letter Tau. If a target time constant is known, then an amount of resistance and/or an amount of capacitance for the resistor and capacitor may be adjusted to satisfy other design criteria for a circuit.

In one embodiment, the resistance of resistor 2 406 and the capacitance of capacitor 2 404 may be configured such that the R2C2 time constant is between 12 nanoseconds and 20 nanoseconds. For example, C2 may be about 1 picofarad and R2 may be about 20,000 ohms. The R1C1 time constant may be configured to be less than or equal to R2C2. For example, C1 may be about 1 picofarad and R1 may be about 10,000 ohms. Those of skill in the art will recognize that the sizing, design, and selection of the resistance for R1, resistor 1 332, and for R2, resistor 2 406, and capacitance for C1, capacitor 1 334 and C2, capacitor 2 404 are design choices that enable embodiments of the OVT and fail-safe snapback ESD protection circuit 400 to serve different use cases.

Since the NMOS transistor 1 328 and NMOS transistor 2 330 are configured to support a 1.8V supply voltage 308, the OVT and fail-safe snapback ESD protection circuit 400 may provide snapback ESD protection within a range of frequencies that the IO pad 302 may experience. Selection of appropriate resistor 1 332, resistor 2 406, capacitor 1 334, and capacitor 2 404, enable the OVT and fail-safe snapback ESD protection circuit 400 to provide OVT protection, ESD protection, and fail-safe protection. In particular, the RC time constant of ESD trigger circuit 314 and the RC time constant of fail-safe protection circuit 402 are configured such that normal operations within a certain frequency range at the IO pad 302 are support. In one embodiment, the OVT and fail-safe snapback ESD protection circuit 400 is configured such that the OVT and fail-safe snapback ESD protection circuit 400 supports operating frequencies for data and signals coupled to the IO pad 302 of up to 1 Megahertz. At such frequencies, the ESD trigger circuit 314, fail-safe protection circuit 402, and gate bias circuit 320 perform the desired functions. If the IO pad 302 will experience frequencies above 1 Megahertz, those of skill in the art may adjust the choice of resistor 1 332, resistor 2 406, capacitor 1 334, and capacitor 2 404, and the associated R1C1 time constant and R2C2 time constant such that the ESD trigger circuit 314 will activate during an ESD event.

In one embodiment, capacitor 1 334 and capacitor 2 404 may be configured to occupy minimal semiconductor area. Resistor 1 332 and resistor 2 406 may in turn be configured to minimize Process, Voltage, and Temperature (PVT) spread. "Process, Voltage, and Temperature (PVT) spread" refers to process variations, voltage level differences, and temperature differences between two fabricated semiconductor devices, or variations that may be experienced by the same device under different operating conditions. PVT spread refers to a measure of how much one electronic component is influenced by PVT variations in relation to how much another electronic component is influenced by PVT variations. PVT spread refers to the differences in relation to one or more of process variation, voltage variations, and/or temperature variations.

Process spread may occur due to differences in the manufacturing process from one wafer to another, or even from one die to another. The semiconductor manufacturing process is rigorously constrained for uniformity, but even minute differences in concentrations of a dopant, minute incursions of impurities, etc., may cause noticeable inconsistencies in the behavior of finished components. Temperature spread may occur due to both the difference in temperature effects in the circuitry at higher or lower die temperatures or when operating at different ambient temperatures. Voltage spread may occur due to different circuit behaviors at high or low voltages, when exposed to voltage fluctuations over time, etc. All of these effects may cause a component meeting the same theoretical design parameters to behave differently from similar parts, or differently in one scenario than in another.

During an ESD event with supply voltage 308 at 0V or off, the ESD voltage on IO pad 302 may act in conjunction with resistor 1 332 and capacitor 1 334 of the ESD trigger circuit 314 to turn on PMOS transistor 8 336 and tie reference voltage node 322 to IO pad 302. Capacitor 2 404 may act to further boost reference voltage node 322 up to IO pad 302. The low supply voltage 308 turns PMOS transistor 5 348 on and NMOS transistor 3 350 off, pulling second gate node 326 to reference voltage node 322. This turns PMOS transistor 6 352 off and PMOS transistor 7 354 on, pulling first gate node 324 to reference voltage node 322 as well, as described above with respect to the OVT snapback ESD protection circuit 300. During normal operation, with supply voltage 308 on, resistor 2 406 and capacitor 2 404 act to allow reference voltage node 322 to follow IO pad 302 at expected signaling speeds (i.e., voltage fluctuation on IO pad 302) without triggering resistor 1 332 and capacitor 1 334 to turn on PMOS transistor 8 336. Thus, overvoltage tolerance during normal operation is also maintained.

Even with supply voltage 308 off during normal operation, the fail-safe protection circuit 402 allows reference voltage node 322 to be pulled to the low supply voltage 308, effectively zero volts. When a higher voltage is experienced on IO pad 302, reference voltage node 322 may also rise, but may remain only slightly above 0V. Thus, the first gate node 324 and second gate node 326 may remain lower than the IO pad 302. This may prevent the NMOS transistor 1 328 and NMOS transistor 2 330 of the 312 from turning on, keeping the IO pad 302 isolated from the ground source 310 and preventing degradation of the 3.3V signal on the IO pad 302.

Figure 5:
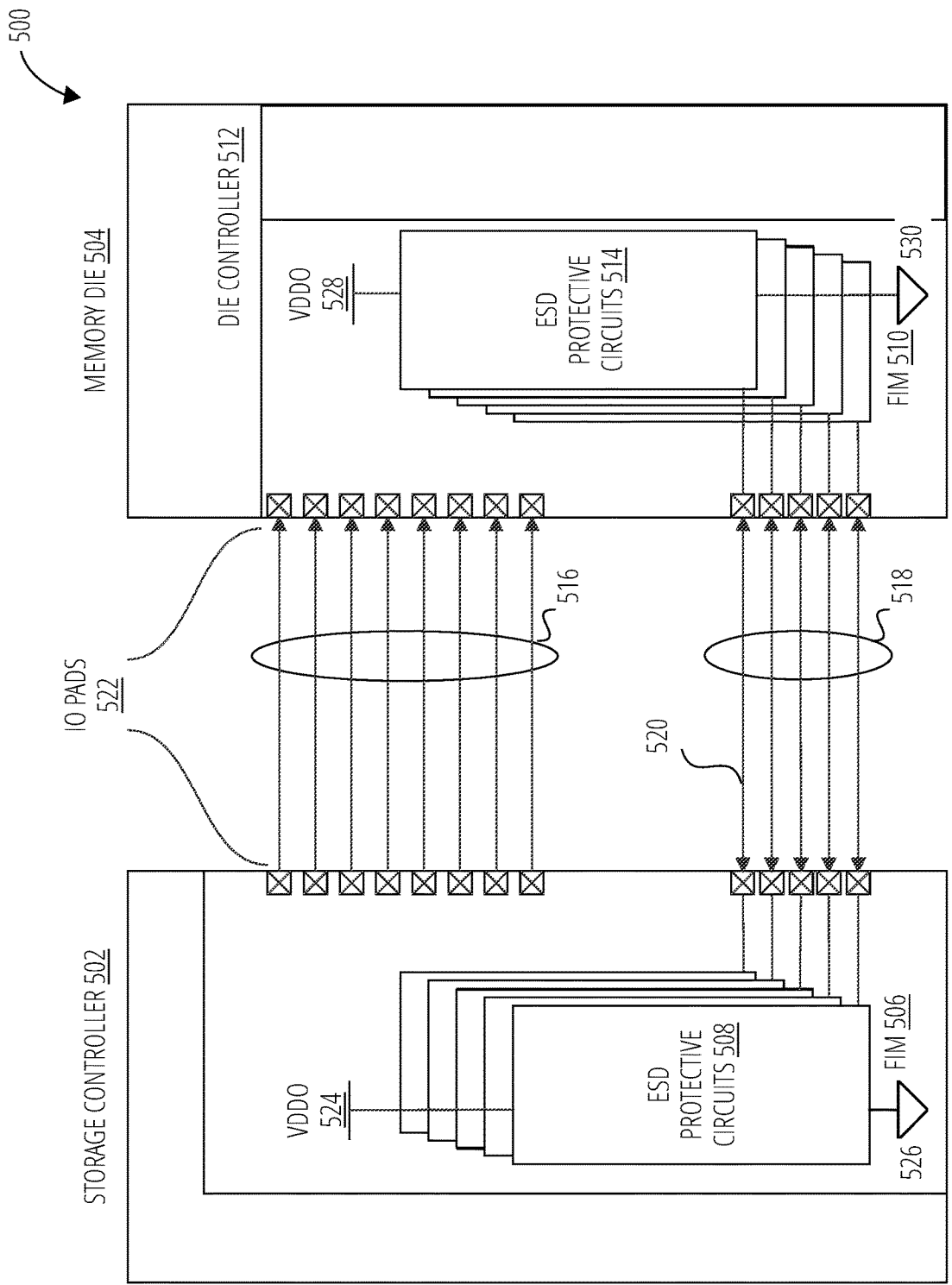
FIG. 5 is a block diagram of an exemplary memory system 500 comprising a storage controller and die controller that may exchange information using embodiments disclosed herein.

FIG. 5 is a block diagram of a memory system 500. The memory system 500 may include a storage controller 502 and a memory die 504. The storage controller 502 may comprise a flash interface manager 506 and ESD protective circuits 508. The memory die 504 may comprise a flash interface manager 510, a die controller 512, and ESD protective circuits 514.

"Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

"Memory die" refers to a small block of semiconducting material on which a given functional circuit is fabricated. Typically, integrated circuits are produced in large batches on a single wafer of electronic-grade silicon (EGS) or other semiconductor (such as GaAs) through processes such as photolithography. The wafer is cut (diced) into many pieces, each containing one copy of the circuit. Each of these pieces is called a die. (Search die (integrated circuit) on Wikipedia.com Oct. 9, 2019. Accessed Nov. 18, 2019.) A memory die is a die, in one embodiment, that includes a functional circuit for operating as a non-volatile memory media and/or a non-volatile memory array.

"Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components.

Communications between the memory die 504 and storage controller 502 may include a data bus 516 and a control bus 518 comprising control lines 520 connecting the flash interface manager 506 of the storage controller 502 to the flash interface manager 510 of the memory die 504.

"Data bus" refers to a communication bus used to exchange one or more of data bits between two electronic circuits, components, chips, die, and/or systems. A data bus may include one or more signal lines. A sender, such as a controller, may send data signals over one or more control lines of the data bus in parallel or in series. Examples data buses may include 8-bit buses having 8 control lines (also called data lines, if they only carry data signals), 16-bit buses having 16 control lines, 32-bit buses having 32 control lines, 64-bit buses having 64 control lines, and the like.

In one embodiment, a single data bus may be shared by a plurality of components, such as memory die. When multiple chips or memory die share a data bus, that data may be accessed or transferred by a single memory die or by all the memory die in parallel based on signals on a chip enable control line.

A data bus may operate, and be configured, according to an industry standard or based on a proprietary protocol and design. Multiple control line of a data bus may be used in parallel and may latch data into latches of a destination component according to a clocking signal, data strobe signal ("DQS"), or clock, such as strobe signal.

"Control bus" refers to a communication bus used to exchange one or more of data, address information, control signals, clock signals, and the like, between two electronic circuits, components, chips, die, and/or systems. Typically, a control bus sends control signals to one or more memory die to manage operations on the memory die.

In certain embodiments, the control bus sends control signals such as write enable ("WE" or "WE#"), chip enable ("CE" or "CE#"), read enable ("RE" or "RE#"), a clock signal, strobe signal ("DQS"), command latch enable ("CLE"), address latch enable ("ALE"), storage operation commands in the form of operation codes ("OP" codes) and addressing information for a communicated storage operation. In certain embodiments, the control bus may not transfer data relating to a storage operation, such as write data or read data. Instead, write data and read data may be transferred over a data bus.

"Storage operation" refers to an operation performed on a memory cell in order to change, or obtain, the value of data represented by a state characteristic of the memory cell. Examples of storage operations include but are not limited to reading data from (or sensing a state of) a memory cell, writing (or programming) data to a memory cell, and/or erasing data stored in a memory cell.

"Interface" refers to a protocol and associated circuits, circuitry, components, devices, systems, sub-systems, and the like that enable one device, component, or apparatus to interact and/or communicate with another device, component, or apparatus.

"Control line" refers to a structure, circuit, circuitry, and/or associated logic configured to convey an electrical current and/or voltage from a source to a destination. In certain embodiments, analog voltages, currents, biases, and/or digital signals supplied or discharged over a control line are used to control switches, select gates, and/or other electrical components. Certain control lines may have a specific name based on what parts of a circuit the control line controls or where the control line couples, or connects, to other circuits. Examples of named control lines include word lines, bit lines, source control lines, drain control lines, and the like. Control line may convey strictly data signals, strictly command or control signal, and/or a combination of both.

"Strobe signal" refers to a digital electric signal applied to a control line by a driver and configured to raise a voltage and/or current of the control line. In certain embodiments, a strobe signal is configured to oscillate between an elevated level and a non-elevated level, and the oscillation occurs over a regular period defined as cycles. Such oscillating strobe signals may serve as a clock, or clock signal, for transferring data in a digital circuit.

Each individual communication line (signal or data) of the data bus 516 and the control bus 518 may be physically coupled, or connected, to IO pads 522 on the storage controller 502 and the memory die 504 in order to bring the data and control signals into the flash interface manager 506 and ESD protective circuits of each device (storage controller 502 or memory die 504).

Data bus 516 signals may be exchanged using high signaling rates, high frequencies. In some embodiments these may reach frequencies similar to the rise time expected of an ESD event. For this reason, the disclosed ESD protective circuits 508 may not be used on data bus 516 IO pads 522. The control lines 520, may include a read enable line, write enable line, and other signals that may operate at slower rates than the data bus. In certain embodiments, the control signals may operate at no more than 1 MHz, which the disclosed circuits (e.g., OVT snapback ESD protection circuit 300 and OVT and fail-safe snapback ESD protection circuit 400) are configured to accept during normal operation. Thus, as illustrated, the control lines 520 may connect from ESD protective circuits 508 of the storage controller 502 to ESD protective circuits 514 of the memory die 504. Of course, the control lines 520 may connect to two or more memory die 504, which may each include ESD protective circuits 514.

The ESD protective circuits 508 of the storage controller 502 may also connect to a supply voltage 524 and a ground source 526 associated with the storage controller 502. The ESD protective circuits 514 of the memory die 504 may connect to a supply voltage 528 and ground source 530 associated with the memory die 504. In some embodiments, power and ground lines to each device may provide a connection to a single power source and a single ground rail. In other embodiments, each device may pull power from separate but equivalent supplies, and in yet other embodiments, the devices may operate at different but compatible voltage levels.

The ESD protective circuits 508 and ESD protective circuits 514 may each comprise the snapback circuit 312, the ESD trigger circuit 314, the fail-safe protection circuit 402, or the pad bias circuit 316 and the trigger boosting circuit 318, and the gate bias circuit 320 disclosed with regard to FIG. 3 and FIG. 4. Thus, the ESD protective circuits 508 and ESD protective circuits 514 may protect the control lines 520 between the storage controller 502 and memory die 504 from ESD events as previously described.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc., are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. An electrostatic discharge (ESD) protection circuit, comprising:
   an Input/Output (IO) pad;
   a ground source;
   a first NMOS transistor having a drain terminal connected to the IO pad, a first gate terminal, and a source terminal;
   a second NMOS transistor having a drain terminal connected in series to the source terminal of the first NMOS transistor, a second gate terminal, and a source terminal connected to the ground source;
   a trigger circuit connected to the IO pad and a reference voltage node, the trigger circuit configured to detect an ESD event at the IO pad;
   a pad bias circuit connected to the IO pad, the trigger circuit, the ground source, and the reference voltage node, the pad bias circuit configured to manage a voltage level for the reference voltage node; and
   a gate bias circuit connected to the reference voltage node, a supply voltage, the ground source, a first gate node connected to the first gate terminal, and a second gate node connected to the second gate terminal, the gate bias circuit configured to dynamically control a voltage level for the first gate node and the second gate node.

2. The circuit of claim 1, wherein the trigger circuit comprises:
   a first capacitor connected to the reference voltage node;
   a first resistor connected to the capacitor, to the IO pad, and to a source terminal of a first PMOS transistor; and
   wherein a gate terminal of the first PMOS transistor connects between the first resistor and the capacitor and a drain terminal of the first PMOS transistor connects to the pad bias circuit.

3. The circuit of claim 2, wherein the first capacitor and the first resistor are connected in series and a voltage level across the first capacitor comprises electromotive force (EMF) of a human body model (HBM) for the ESD event multiplied by $(1-e^{-t/R1C1})$, where e is Euler's number, R1 is a resistance of the first resistor, C1 is a capacitance of the first capacitor, and R1C1 is a time constant; and
   wherein the resistance of the first resistor and the capacitance of the first capacitor are configured such that the time constant is about 10 nanoseconds.

4. The circuit of claim 3, wherein C is about 1 picofarad and R is about 10,000 ohms.

5. The circuit of claim 1, wherein the gate bias circuit comprises:
   a second PMOS transistor having a source terminal connected to the reference voltage node, a drain terminal connected to the first gate node, and a gate terminal connected to the supply voltage;
   a third PMOS transistor having a source terminal connected to the supply voltage, a drain terminal connected to the first gate node, and a gate terminal connected to the second gate node;
   a fourth PMOS transistor having a source terminal connected to the reference voltage node, a drain terminal connected to the second gate node, and a gate terminal connected to the supply voltage; and a third NMOS transistor having a source terminal connected to the ground source, a drain terminal connected to the second gate node, and a gate terminal connected to the supply voltage.

6. The circuit of claim 1, wherein the pad bias circuit comprises:
a fifth PMOS transistor having a source terminal connected to the IO pad, a gate terminal connected to a drain terminal of the fifth PMOS transistor;
a sixth PMOS transistor having a source terminal connected to the drain terminal of the fifth PMOS transistor, a gate terminal connected to a drain terminal of the sixth PMOS transistor;
a seventh PMOS transistor having a source terminal connected to the drain terminal of the sixth PMOS transistor, a gate terminal connected to a drain terminal of the seventh PMOS transistor; and
an eighth PMOS transistor having a source terminal connected to the drain terminal of the seventh PMOS transistor, a gate terminal connected to a drain terminal of the eighth PMOS transistor, the drain terminal of the eighth PMOS transistor also connected to the ground source.

7. The circuit of claim 1, further comprising a trigger boosting circuit connected to the pad bias circuit by the IO pad and connected to the reference voltage node.

8. The circuit of claim 7, wherein the trigger boosting circuit comprises a second capacitor connected to the pad bias circuit by the IO pad and connected to the reference voltage node.

9. The circuit of claim 1, further comprising a trigger boosting circuit configured to complement the trigger circuit and mitigate electrical stress on the IO pad, the first NMOS transistor, and the second NMOS transistor during the ESD event.

10. An electrostatic discharge (ESD) protection circuit comprising:
an Input/Output (IO) pad;
a ground source;
a first NMOS transistor having a drain terminal connected to the IO pad, a first gate terminal, and a source terminal;
a second NMOS transistor having a drain terminal connected in series to the source terminal of the first NMOS transistor, a second gate terminal, and a source terminal connected to the ground source;
a trigger circuit connected to the IO pad and a reference voltage node, the trigger circuit configured to detect an ESD event at the IO pad;
a fail-safe protection circuit connected to the IO pad, the trigger circuit, a supply voltage, and the reference voltage node, the fail-safe protection circuit configured to manage a voltage level for the reference voltage node to enable a voltage level at the IO pad to rise to a predetermined threshold when the supply voltage is substantially zero;
a gate bias circuit connected to the reference voltage node, the supply voltage, the ground source, a first gate node connected to the first gate terminal, and a second gate node connected to the second gate terminal, the gate bias circuit configured to dynamically control a voltage level for the first gate node and the second gate node.

11. The circuit of claim 10, wherein the trigger circuit comprises:
a first capacitor connected to the reference voltage node;
a first resistor connected to the first capacitor, to the IO pad, and to a source terminal of a first PMOS transistor; and
wherein a gate terminal of the first PMOS transistor connects between the first resistor and the first capacitor and a drain terminal of the first PMOS transistor connects to a pad bias circuit.

12. The circuit of claim 11, wherein the gate bias circuit comprises:
a second PMOS transistor having a source terminal connected to the reference voltage node, a drain terminal connected to the first gate node, and a gate terminal connected to the supply voltage;
a third PMOS transistor having a source terminal connected to the supply voltage, a drain terminal connected to the first gate node, and a gate terminal connected to the second gate node;
a fourth PMOS transistor having a source terminal connected to the reference voltage node, a drain terminal connected to the second gate node, and a gate terminal connected to the supply voltage; and
a third NMOS transistor having a source terminal connected to the ground source, a drain terminal connected to the second gate node, and a gate terminal connected to the supply voltage.

13. The circuit of claim 12, wherein the fail-safe protection circuit comprises:
a second capacitor connected to the trigger circuit and the IO pad; and
a second resistor connected to the second capacitor by way of the reference voltage node and connected the supply voltage.

14. The circuit of claim 13, wherein the first capacitor and the first resistor are connected in series and a voltage level across the first capacitor comprises electromotive force (EMF) of a human body model (HBM) for the ESD event multiplied by $(1-e^{-t/R1C1})$, where e is Euler's number, R1 is a resistance of the first resistor, C1 is a capacitance of the first capacitor, and R1C1 is a first time constant; and
wherein the resistance of the first resistor and the capacitance of the first capacitor are configured such that the first time constant is about 10 nanoseconds.

15. The circuit of claim 14, wherein the second capacitor and the second resistor are connected in series and a voltage level across the second capacitor comprises a fail-safe voltage threshold multiplied by $(1-e^{-t/R2C2})$, where e is the Euler's number, R2 is a resistance of the second resistor, C2 is a capacitance of the second capacitor, and R2C2 is a second time constant; and
wherein the resistance of the second resistor and the capacitance of the second capacitor are configured such that the second time constant is between about 12 nanoseconds and about 20 nanoseconds.

16. The circuit of claim 15, wherein the resistance of the first resistor and the capacitance of the first capacitor and the resistance of the second resistor and the capacitance of the second capacitor are configured such that the R1C1 is less than or equal to the R2C2.

17. The circuit of claim 15, wherein the first capacitor and the second capacitor are configured to occupy minimal semiconductor area and the first resistor and the second resistor are configured to minimize Process, Voltage, and Temperature (PVT) spread.

18. The circuit of claim 15, wherein the C1 is about 1 picofarad and the R1 is about 10,000 ohms; and
wherein the C2 is about 1 picofarad and the R2 is about 20,000 ohms.

19. The circuit of claim 15, wherein the circuit is configured to support operating frequencies of less than one megahertz on the IO pad.

20. A control bus of a memory die comprising:
- a plurality of control lines, each control line comprising an electrostatic discharge (ESD) protection circuit comprising:
- an Input/Output (IO) pad;
- a ground source;
- a first NMOS transistor having a drain terminal connected to the IO pad, a first gate terminal, and a source terminal;
- a second NMOS transistor having a drain terminal connected in series to the source terminal of the first NMOS transistor, a second gate terminal, and a source terminal connected to the ground source;
- a trigger circuit connected to the IO pad and a reference voltage node, the trigger circuit configured to detect an ESD event at the IO pad by way of a first resistor and a first capacitor each configured to charge the first capacitor within a first time constant less than 10 nanoseconds;
- a fail-safe protection circuit connected to the IO pad, the trigger circuit, a supply voltage, and the reference voltage node, the fail-safe protection circuit configured to manage a voltage level for the reference voltage node to enable a voltage level at the IO pad to rise to a fail-safe voltage threshold when the supply voltage is substantially zero, the fail-safe protection circuit comprising a second resistor and a second capacitor each configured to charge the second capacitor within a second time constant greater than the first time constant; and
- a gate bias circuit connected to the reference voltage node, the supply voltage, the ground source, a first gate node connected to the first gate terminal, and a second gate node connected to the second gate terminal, the gate bias circuit configured to dynamically control a voltage level for the first gate node and the second gate node.

* * * * *